(12) United States Patent
Gonsiorawski

(10) Patent No.: US 7,238,878 B2
(45) Date of Patent: Jul. 3, 2007

(54) PHOTOVOLTAIC MODULE WITH LIGHT REFLECTING BACKSKIN

(76) Inventor: Ronald C. Gonsiorawski, 18 Bradley Rd., Danvers, MA (US) 01923

( * ) Notice: Subject to any disclaimer, the term of this patent is extended or adjusted under 35 U.S.C. 154(b) by 0 days.

(21) Appl. No.: 10/458,616

(22) Filed: Jun. 10, 2003

(65) Prior Publication Data

US 2004/0035460 A1 Feb. 26, 2004

(51) Int. Cl.
*H01L 31/052* (2006.01)
(52) U.S. Cl. ............ 136/246; 136/244; 136/251; 136/259; 257/433; 257/436; 257/788; 257/790; 438/67; 438/69; 438/72; 438/73; 438/80
(58) Field of Classification Search .......... 136/251, 136/244, 246, 259; 257/433, 436, 788, 790; 438/67, 69, 72, 73, 80
See application file for complete search history.

(56) References Cited

U.S. PATENT DOCUMENTS

| | | | |
|---|---|---|---|
| 3,018,313 A | | 1/1962 | Gattone |
| 3,973,994 A | | 8/1976 | Redfield |
| 4,042,417 A | | 8/1977 | Kaplow et al. |
| 4,053,327 A | | 10/1977 | Meulenberg, Jr. |
| 4,235,643 A | | 11/1980 | Amick |
| 4,313,023 A | | 1/1982 | Stephens |
| 4,321,417 A | | 3/1982 | Kurth et al. |
| 5,261,970 A | * | 11/1993 | Landis et al. ............ 136/259 |
| 5,554,229 A | | 9/1996 | Vogeli |
| 5,741,370 A | | 4/1998 | Hanoka |
| 5,994,641 A | * | 11/1999 | Kardauskas ............ 136/246 |
| 6,319,596 B1 | | 11/2001 | Kernander et al. |
| 6,320,116 B1 | | 11/2001 | Hanoka |
| 6,323,415 B1 | * | 11/2001 | Uematsu et al. ......... 136/246 |
| 6,350,945 B1 | * | 2/2002 | Mizuno .................. 136/246 |
| 6,353,042 B1 | | 3/2002 | Hanoka et al. |
| 6,369,316 B1 | | 4/2002 | Plessing et al. |
| 6,660,930 B1 | * | 12/2003 | Gonsiorawski ........... 136/251 |
| 2003/0000568 A1 | | 1/2003 | Gonsiorawski |

FOREIGN PATENT DOCUMENTS

| | | | |
|---|---|---|---|
| JP | 62-101247 U | * | 6/1987 |
| JP | 2001-119056 | | 4/2001 |

OTHER PUBLICATIONS

V-Groove Faceted Reflector For Enhanced Module Output, by James A. Amick and William T. Kurth—pp. 1376-1381 IEEE, 1981.
Bigger Gaps Make PV Cells More Efficient, by the CADDET Japanese National Team (3 pages), date unknown.

* cited by examiner

Primary Examiner—Nam Nguyen
Assistant Examiner—Anthony Fick
(74) Attorney, Agent, or Firm—Hamilton, Brook, Smith & Reynolds, P.C.

(57) ABSTRACT

A photovoltaic module comprises electrically interconnected and mutually spaced photovoltaic cells that are encapsulated by a light-transmitting encapsulant between a light-transparent front cover and a back cover, with the back cover sheet being an ionomer/nylon alloy embossed with V-shaped grooves running in at least two directions and coated with a light reflecting medium so as to provide light-reflecting facets that are aligned with the spaces between adjacent cells and oriented so as to reflect light falling in those spaces back toward said transparent front cover for further internal reflection onto the solar cells, whereby substantially all of the reflected light will be internally reflected from said cover sheet back to the photovoltaic cells, thereby increasing the current output of the module. The internal reflector improves power output by as much as 67%.

19 Claims, 3 Drawing Sheets

PHOTOVOLTAIC MODULE WITH LIGHT REFLECTING BACKSKIN

This invention was made under Department of Energy Subcontract No. ZAX-8-17647-10.

FIELD OF THE INVENTION

This invention relates to solar cell modules having reflector means for utilizing light impinging on areas between solar cells which would normally not be utilized in photoelectric conversion, whereby to increase the power output of the module.

BACKGROUND OF THE INVENTION

Photovoltaic (PV) cells used for photoelectric conversion, e.g., silicon solar cells, are relatively small in size, typically measuring 2–4" on a side in the case of cells made from rectangular EFG-grown substrates. It is common industry practice to combine a plurality of PV cells into a physically integrated PV module having a correspondingly greater power output. Also, several PV modules may be connected together to form a large array with a correspondingly greater power output. Typically PV modules are formed from 2 or more "strings" of solar cells, with each string consisting of a plurality of cells arranged in a row and electrically connected in series, and the several strings being arranged physically in parallel with one another so as to form an array of cells arranged in parallel rows and columns with spaces between adjacent cells. The several strings are electrically connected to one another in a selected parallel or series electrical circuit arrangement, according to voltage and current requirements.

For various reasons, it has been common practice for the modules to be laminated structures. These laminated structures consist of front and back protective cover sheets, with the front sheet being stiff and made of clear glass or a suitable plastic material that is transparent to solar radiation, and the back cover sheet (commonly called a "backskin") being made of the same or a different material as the front sheet. Disposed between the front and back sheets in a sandwich arrangement are the interconnected solar cells and a light-transparent polymer material that encapsulates the solar cells and also is bonded to the front and back sheets so as to physically seal off the cells. The laminated structure provides mechanical support for the cells and also protects them against damage due to environmental factors such as wind, snow, and ice. Another common practice is to fit the laminated module into a metal frame, with a sealant covering the edges of the module engaged by the metal frame. The metal frame protects the edges of the module, provides additional mechanical strength, and facilitates combining it with other modules so as to form a larger array or solar panel that can be mounted to a suitable support that holds the modules at the proper angle to maximize reception of solar radiation.

When a plurality of cells are arrayed in a module, the total active surface area of the array (i.e., the active area of the front faces of the solar cells) is less than the total area exposed to radiation via the transparent front protective sheet. For the most part this is due to the fact that adjacent cells do not touch each other and also the cells at the periphery of the array may not extend fully to the outer edges of the front protective sheet. Consequently, less than all of the solar radiation that is received by the PV module impinges on active solar cell areas, with the remainder of the received solar radiation impinging on any inactive areas that lie between the cells or border the entire array of cells.

A number of techniques have been proposed for increasing the efficiency and effectiveness of PV modules by concentrating incident solar radiation onto active cell areas. U.S. Pat. No. 4,235,643, issued Nov. 25, 1980 to James A. Amick for "Solar Cell Module", discloses a solar cell module characterized by a solar cell support having a plurality of wells for receiving individual solar cells, with the surface of the support between the cells having a plurality of light-reflective facets in the form of V-shaped grooves, with the angle at the vertex formed by two mutually-converging facets being between 110° and 130°, preferably about 120°, whereby light impinging on those facets would be reflected back into the transparent cover layer at an angle Ø greater than the critical angle, and then reflected again internally from the front surface of the cover layer so as to impinge on the solar cells. The term "critical angle" refers to the largest value that the angle of incidence may have for a ray of light passing from a denser optical medium to a less dense optical medium. As is well known, if the angle of incidence Ø exceeds the critical angle, the ray of light will not enter the less dense medium (e.g., air) but will be totally internally reflected back into the dense medium (e.g., the transparent cover layer 54 of Amick).

U.S. Pat. No. 5,994,641, issued Nov. 30, 1999 to Michael J. Kardauskas for "Solar Module Having Reflector Between Cells", discloses an improvement over the Amick invention by incorporating a light-reflecting means in the form of an optically-reflective textured sheet material in a laminated module comprising a transparent front cover, a back cover, a plurality of mutually spaced and electrically-interconnected photovoltaic cells disposed between the front and back covers, and a transparent encapsulant material surrounding the cells and bonded to the front and back covers. The optically-reflective sheet material is disposed between the cells and also between the cells and the outer periphery of the module. The optically-reflective textured sheet material of Kardauskas comprises a substrate in the form of a thin and flexible thermoplastic film and a light reflecting coating on one side of the substrate, with the substrate being textured by embossing so as to have a plurality of contiguous v-shaped grooves characterized by flat mutually-converging surfaces ("facets") that extend at an angle to one another in the range of 110°-130°, preferably about 120°. The light-reflecting facets extend in a predetermined angular relationship with respect to the front cover, so that light impinging on that those facets will be reflected upwardly back through the covering transparent encapsulant and the glass to the glass interface with air, and then backwards through the glass and covering encapsulant toward active areas of the cells. Kardauskas teaches that the light-reflecting coating may be either a light-reflecting metal film or a dielectric stack comprising multiple layers of materials arranged to form a reflecting mirror.

The Kardauskas patent teaches the use of a reflective material having a linear pattern of grooves wherein all of the grooves are parallel to one another. It also teaches that the embossed linear pattern of grooves may be replaced by an embossed herringbone pattern of grooves. In one arrangement, a sheet of the reflective material with a linear pattern of grooves is placed between the cells and the backskin, with the sheet being large enough so that it extends beyond the perimeter of the array of cells. The grooves of that sheet extend in the same direction as the columns or rows. Then additional strips of the same material are placed over the larger sheet in those portions of the land areas between the cells so that the grooves form a pattern wherein certain of the grooves extend parallel to the cell rows and other grooves extend parallel to the cell columns. More precisely, the linear grooves between adjacent rows are oriented at a right angle to the grooves between columns, so as to improve the amount of light that is internally reflected from the areas between the cells back onto the front surfaces of the cells. Kardauskas teaches a second way to obtain a patterned groove arrangement using his reflective material with linear pattern of grooves. The second way comprises cutting the reflective sheet material with a linear groove pattern into a plurality of strips, with individual strips being placed between adjacent columns and other strips being placed between adjacent rows so that the grooves of the strips between rows extend at a right angle to the grooves of the strips between columns.

The advantage of the Kardauskas invention is that it provides a material improvement in power output. As disclosed in the Kardauskas patent, a plurality of test cell coupons, each comprising a square cell measuring 100 mm on each side and surrounded on each side by a 25 mm. wide strip of laminated reflective film material, with the 0.002" deep V-shaped grooves of that material running in one direction along two opposites sides of the cell and running in a second direction at a right angle to the first direction along the other two sides of the cell, were found to show improvements in power output in the range of 20.8% to 25.6% when illuminated by a solar simulator light source. A limitation of the Kardauskas invention is that introduces an additional separate component to the module and the laminating process.

Japan Published Patent Application No. 62-101247 discloses the concept of providing a solar cell module with a reflective back cover sheet in the form of a laminate comprising a polyester base layer and a light-reflecting aluminum coating, with the back cover sheet having a plurality of V-shaped grooves that provide angular light reflecting facets. The cells are spaced from one another in front of the back sheet, so that incident light passing through the front cover sheet and between the cells is reflected by the back cover sheet back to the transparent front cover sheet.

The module is made by placing the front and back cover sheets, the cells and an encapsulant in the form of EVA (ethylene-vinyl acetate polymer) in a laminating apparatus having an embossing platen, with the back cover sheet comprising a flat polyester base layer and an aluminum coating on the front side of the base layer. The polyester base layer faces the embossing platen. When the apparatus is operated to form a laminated solar module as described, it subjects the assembled components to heat and pressure, causing the encapsulant to melt and the platen to emboss a linear grooved pattern into the back cover sheet, with the result that back cover sheet has grooves on both its front and back sides. The manufacturing procedure taught by Japan Published Patent Application No. 62-101247 has two limitations.

First of all, the aluminum cover sheet does not directly engage the embossing platen, and hence the precision with which grooves are embossed in the aluminum coating depends on how precisely the platen can emboss grooves in the polyester base layer. Secondly, polyester films have a high melt temperature, typically about 250 degrees C. or higher, and must be heated under pressure to at least their melt point in order to be permanently deformed into a pattern of grooves by the embossing platen. Conventional polyester, i.e., polyethylene terephthalate (PET) has a melt point of about 250 degrees C., while poly 1,4 cyclo-hexanedimethanol terephthalate (PCT) has a melt point of 290 degrees C. However, EVA encapsulant has a melt point of about 150 degrees C. and will deteriorate if over heated. Consequently the laminating and embossing temperature must be limited to avoid overheating the EVA, but limiting that temperature has the effect of making it more difficult to permanently and precisely emboss the polyester base with sharp V-shaped grooves that are replicated in the aluminum coating. If the grooves formed in the aluminum coating do not have flat sides that converge at the required angle, less light will be internally reflected in the desired mode, thereby limiting any increase in module power output resulting from the use of a reflective back sheet.

The design disclosed by Japan Published Patent Application No. 62-101247 has been utilized in PV modules made by Sharp Corp. and described in an article published by the CADDET Japanese National Team entitled "Bigger Gaps Make PV Cells More Efficient". That publication indicates includes a drawing illustrating a module with a grooved reflective back cover sheet as disclosed by Japan Published Patent Application No. 62-101247. However, that article also indicates that an improvement of cell power output of only 4% is achieved by Sharp modules having the multi-groove reflecting back cover sheet. One possible explanation for the failure to achieve a greater improvement in power output may be how the reflective back sheet is made. Another explanation is that the grooves all extend in the same direction.

OBJECTS AND SUMMARY OF THE INVENTION

The primary object of this invention is to provide a new and improved PV module having an internal reflector that improves the power output of the module.

A more specific object is to provide a multi-cell PV module having an improved form of optically reflective backskin for internally reflecting solar radiation that passes between the cells.

Another object is to improve upon the state of the technology represented by U.S. Pat. No. 5,994,641 and Japan Published Patent Application No. 62-101247.

A further object is to provide a PV module having a textured, optically reflective backskin that is resistant to cracking, impervious to water, non-reactive chemically with other cell components, and has a high resistance to weathering.

Still another object is to provide a PV module with an internal reflector that exhibits a power output that is substantially greater, e.g., 47%–67% greater, than the power output of a PV module of like construction that lacks an internal reflector.

The foregoing objects are achieved by providing a PV module that comprises front and back covers of sheet material, with the front cover being transparent, a plurality of PV cells disposed between the front and back covers and spaced from one another so that predetermined areas of the back cover are not concealed by the cells, and a light-transmitting material encapsulating the cells and bonded to the front and back covers, with the back cover comprising a sheet of an ionomer/nylon alloy that is characterized by a plurality of light-reflecting facets facing the front cover, the facets having an angular relationship such that light passing through the front cover and impinging on the facets is reflected back toward the front cover at an angle relative to the front cover which is greater than the critical angle, whereby the reflected light is internally reflected by the front cover back toward the cells, thereby increasing the current output of the module. The facets are formed by embossing sharp V-shaped grooves in one front side of the ionomer/nylon alloy sheet and then coating that front side of the facets with a reflective coating, with the grooves having a depth that is less than the thickness of the ionomer/nylon sheet so that the rear surface of that sheet is flat.

Other features and advantages of the invention are described or set forth in the following detailed specification that is to be considered together with the accompanying drawings.

THE DRAWINGS

Figure 2:
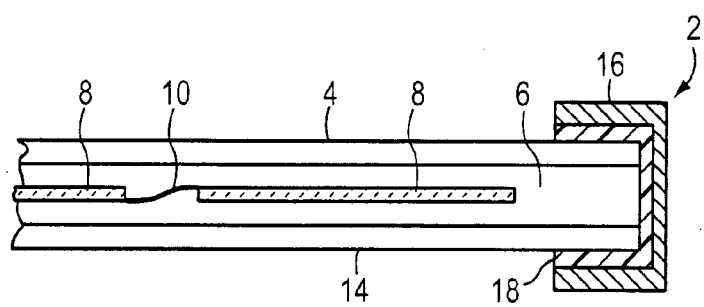
FIG. 2 is a fragmentary sectional view in elevation of the laminated module illustrating how the PV (solar) cells are interconnected and embedded in a transparent encapsulant.
Figure 3:
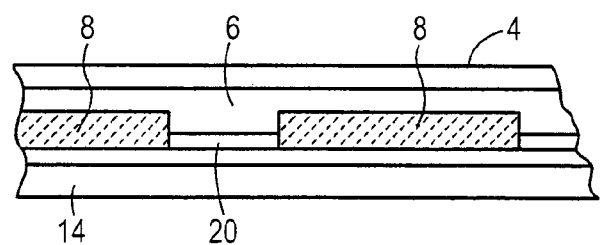

FIG. 3 is a fragmentary sectional view similar to FIG. 2 but illustrating one form of the internal reflector invention disclosed by Kardauskas U.S. Pat. No. 5,994,641.

Figure 1:
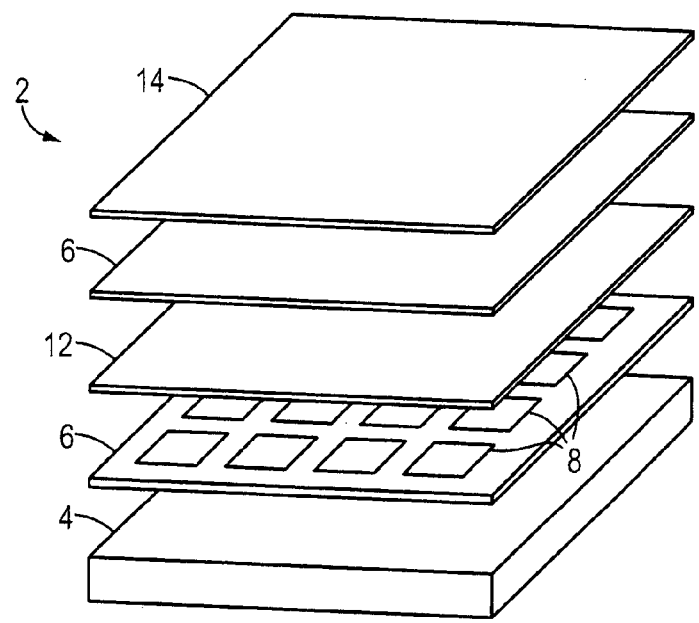
FIG. 1 is an exploded schematic representation of the components of a typical laminated photovoltaic module.
Figure 4:
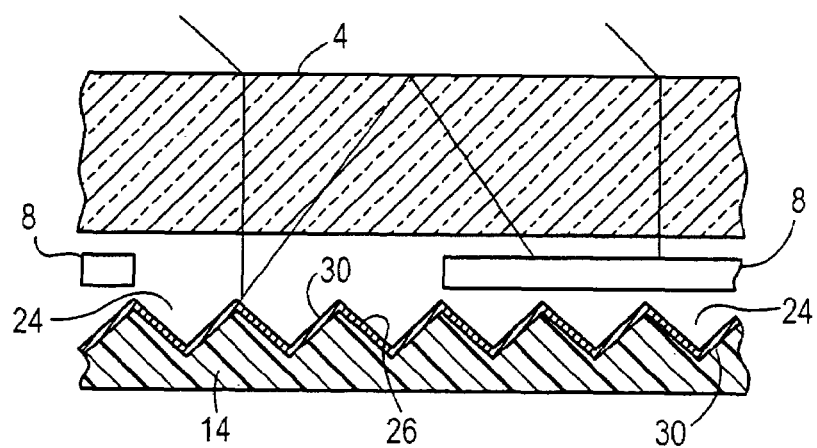

FIG. 4 is a fragmentary sectional view on an enlarged scale through a modification of the module of FIGS. 1 and 2 that incorporates the present invention.

Figure 5:
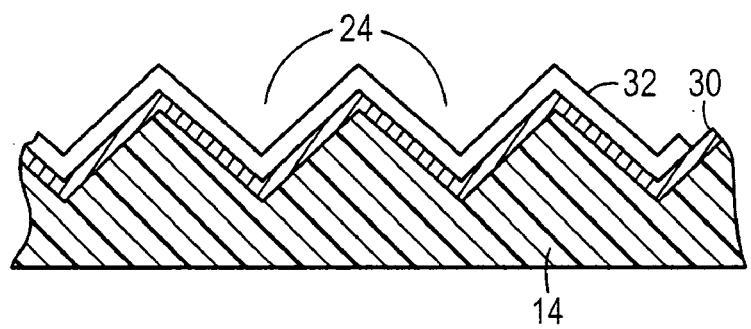

FIG. 5 is an enlargement of a portion of FIG. 4.

Figure 6:
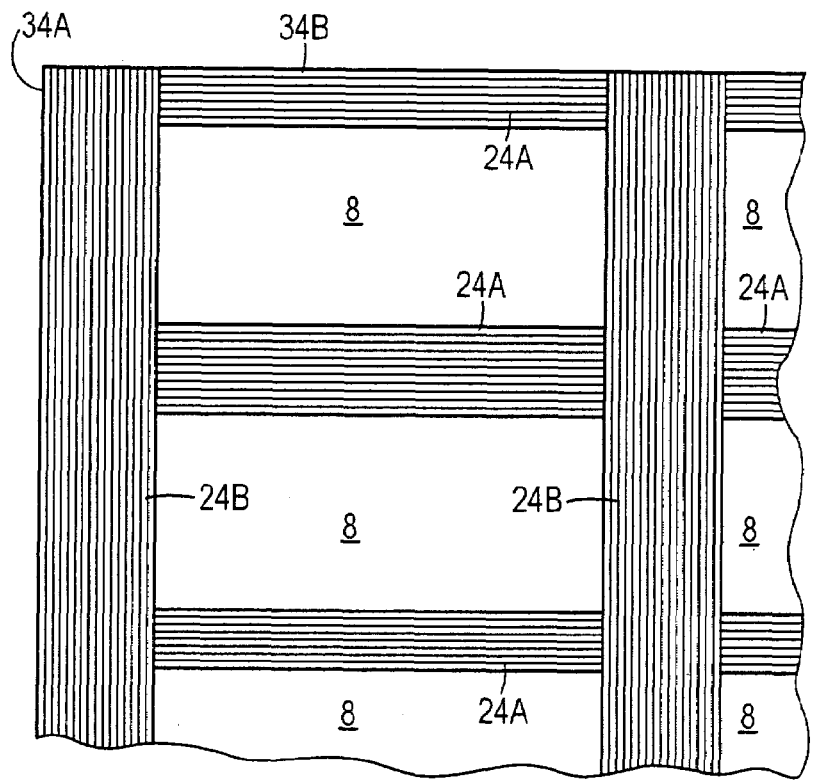
Figure 7:
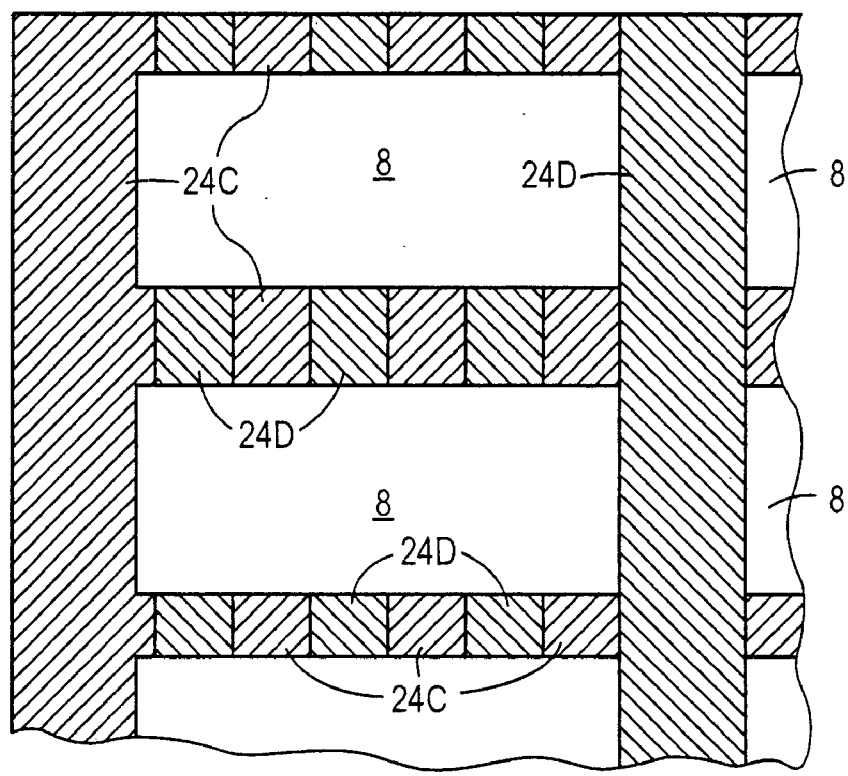

FIG. 6 is a plan view illustrating one form of reflector pattern embodied in the backskin; and FIG. 7 illustrates a preferred form of reflector pattern for the backskin.

In the several drawings, the relative thicknesses of the components are not intended to be to scale and the thicknesses of some components of the laminated module are exaggerated in relation to the other components solely for convenience of illustration. In the several views, like numerals identify like components.

DETAILED DESCRIPTION OF THE INVENTION

FIGS. 1 and 2 schematically illustrate components of a conventional form of laminated solar cell module 2 that may be modified to incorporate the present invention. The components used to construct the solar cell module comprise a stiff and transparent front cover or superstrate 4 that is made of glass or a suitable plastic such as polycarbonate or an acrylic polymer, a first layer 6 of a light transmitting encapsulant such as EVA, an array of separately formed crystalline silicon solar cells 8 interconnected by conductors 10 (FIG. 2), a porous scrim sheet 12 (omitted from FIG. 2 for convenience of illustration), a second layer 6 of a transparent encapsulant, and a protective back cover or backskin 14 made of an electrically insulating material, e.g. Tedlar™. The conductors 10 commonly are arranged with a stress-relief loop.

Each PV cell has a p-n junction (not shown) adjacent to its front radiation-receiving surface, a first electrode or contact (not shown) on its front radiation-receiving surface and a second electrode or contact (also not shown) on its back surface, with the conductors 10 being soldered to those contacts to establish the desired electrical circuit configuration. Each of the layers 6 may comprise one or more sheets of encapsulant material, depending upon the thickness in which the encapsulant is commercially available. Although not shown, it is to be understood that the solar cells are oriented so that their light-receptive surfaces face front cover 4, and also the cells in each row are connected in series to form strings, with the several strings being interconnected by other conductors similar to conductors 10 and with the whole array having terminal leads (not shown) that extend out through a side of the assembly of components (or through the back cover) for electrically connecting the module to another module or to directly to an exterior circuit.

The foregoing components are assembled in sandwich fashion, starting with front cover 4 on the bottom, as shown in FIG. 1. After the sandwich has been assembled, it is transferred to a laminating apparatus (not shown) where its components are subjected to the laminating process. The laminating apparatus is essentially a vacuum press having heating means and a flexible wall or bladder member that coacts with a wall member or platen to compress the components together when the press is closed and evacuated. The sandwich is positioned within the press and then the closed press is operated so as to heat the sandwich in vacuum to a selected temperature at which the encapsulant will melt enough to flow around the cells, usually a temperature of at least 120° C., with the pressure applied to the components increasing at a selected rate to a maximum level, usually in the range of about 500 to about 700 torr. These temperature and pressure conditions are maintained long enough, typically for about 3 to 10 minutes, to assure that the layers of encapsulant 6 have flowed enough to merge together so as fully encapsulate the interconnected cells and also fully contact the front and back panels (FIG. 2), after which the pressure is maintained at or near the foregoing level or terminated while the assembly is allowed to cool to about 80° C. or less so as to cause the encapsulant to form a solid bond with the adjacent components of the module. When the temperature reaches about 80° C. or less, the pressure gradient is reduced to zero and the press opened for removal of the laminated module. The pressure exerted on the sandwich of module components reaches its maximum level only after the assembled components have reached the desired maximum temperature in order to allow the ionomer to flow as required and also to assure full removal of air and moisture.

The laminated assembly of the foregoing components can be provided with a surrounding frame 16 with a sealant 18 preferably disposed between the frame and the edges of the laminated assembly. The frame may be made of metal or molded of a suitable thermosetting or a dense thermoplastic polymeric material. See U.S. Pat. No. 5,762,720 issued Jun. 9, 1998 to Jack I. Hanoka et al., U.S. Pat. No. 5,733,382 issued Mar. 31, 1998 to Jack I. Hanoka, and U.S. Pat. No. 5,478,402, issued Dec. 26, 1995 to Jack I. Hanoka all of which are incorporated herein by reference.

FIG. 3 illustrates one of the embodiments disclosed in Kardauskus U.S. Pat. No. 5,994,641, supra. For convenience of illustration, the conductors linking the cells 8 are omitted from this figure. FIG. 3 illustrates the addition of strips of textured light reflecting material 20 between the individual cells 8, with each strip 20 consisting of (1) a thin and flexible thermoplastic film formed on its front side with a plurality of contiguous V-shaped grooves (not shown), and (2) a light-reflecting coating overlying the front side of the film. The strips are arranged so that the grooves of some strips run parallel to the rows of cells and the grooves of other strips run parallel to the columns of cells.

Referring now to FIG. 4, one embodiment of the present invention involves use of an ionomer/nylon alloy backskin or back cover sheet 14 whose inner (front-facing) surface is embossed so as to provide on its front side a pattern of V-shaped grooves identified generally at 24. Each of the grooves is defined by flat mutually-converging surfaces or facets 26 that extend at a predetermined angle to one another in the range of 110° to 130°, preferably about 120°. Accordingly each facet 26 extends at an angle of between 25° and 35° relative to the plane of cover member 4. Depending on the thickness of the back cover sheet, each groove has a depth in the range of 0.001 inch to 0.006 inch, preferably a depth of approximately 0.004 inch. Preferably the back cover sheet incorporates $TiO_2$ to render it white. Alternatively the back cover sheet may incorporate carbon black. A white backskin is preferred since it reflects sunlight and hence has a better resistance to deterioration from sunlight. A back cover sheet colored by carbon black will absorb sunlight but only to a limited depth, so that the core of the back cover sheet is substantially unaffected by the absorbed solar energy. The back cover sheet also may be rendered opaque to sunlight by some other additive. The grooved front-facing surface of the back cover sheet is provided with a light-reflecting coating 30 that is applied to after the ionomer/nylon sheet has been embossed with grooves 24. The embossing may be accomplished in various ways known to persons skilled in the art. The coating may take the form of a metal film having a thickness in the order of 300 angstroms to 1000 angstroms. Silver and aluminum are obvious choices, but silver is preferred since its reflectivity is sufficiently higher than aluminum to offset the difference in cost.

Referring to FIG. 5, preferably a thin light-transparent electrically-insulating coating 32 is applied over the metal film in order to avoid any possibility of short-circuiting of the cells in those areas where the thickness of the encapsulant separating the cells from the backskin is reduced to zero or near zero, as may occur as an unintended consequence of encapsulant flow during the laminating process. By way of example but not limitation, insulating coating 32 may be a thin film of an acrylic polymer or an inorganic material such as $SiO_2$, $MgF_2$, or $Si_3N_4$. Depending on its composition, coating 32 may be applied by various methods known to persons skilled in the art, e.g., by vapor deposition, spraying, sputtering, etc.

As an alternative to the use of a metal film as the reflecting medium, the invention also contemplates replacing the reflective metal coating with a light-reflecting dielectric stack comprising multiple layers of materials such as $SiO_2$ and $Si_3N_4$ or clear organic polymers of suitable refractive index arranged so as to form a reflecting mirror. As noted in Kardauskas U.S. Pat. No. 5,994,641, dielectric mirrors are well known. In this connection, the information contained in Kardauskas U.S. Pat. No. 5,994,641 is incorporated hereby by reference. Other examples of dielectric films that may be used are presented by U.S. Pat. No. 6,208,680, issued Mar. 27, 2001 to L. M. Chirofsky et al for "Optical Devices Having ZNS/Ca-MG-Fluroide Multilayered Mirrors". Organic layers of appropriate refractive index also may be used as the reflecting medium. Still other forms of dielectric mirrors may be applied to as an adherent coating to the inner surface of backskin 14. Of course, insulating coating 32 is not required if the reflecting medium is a dielectric stack.

FIGS. 6 and 7 are fragmentary plan view of photovoltaic modules with backskins that are characterized by two different reflector patterns. FIGS. 6 and 7 each illustrate a corner portion of a module. In both cases the modules comprise a plurality of cells 8 arranged in a grid pattern of rows and columns with spaces between adjacent cells and also at the margins of the modules, i.e., around the periphery of the array of cells. The cells overlie the backskin (with encapsulant interposed between and bonding the cells to the backskin as described above).

Referring to FIG. 6, the front surface of the backskin 14 is embossed with V-shaped spaced grooves 24A that are interrupted periodically by a plurality of grooves 24B that extend at a right angle to grooves 24A. For convenience each plurality or group of grooves 24A may be viewed as a row and each plurality or g group of grooves 24B may be viewed as a column. Portions of two columns of grooves 24B are shown in FIG. 6. The width of the columns of grooves 24B and the spacing between adjacent columns of grooves 24B may vary. In FIG. 6, the columns of grooves are shown spaced apart a distance approximately the same as the corresponding dimension (width) of the cells 8. However, the spacing between the columns of grooves may be greater or less than that of the cells. The pattern of grooves shown in FIG. 6 is continued throughout the entire expanse of the backskin's front surface. Thus the areas of the front surface of the backskin that are concealed by cells 8 are also embossed with grooves. Although the grooves are shown in FIG. 6 as extending parallel to the side edges 34A and 34B of the module, it is to be understood that the backskin may be incorporated in the module so that grooves 24A and 24B do not extend parallel to any of the side edges of the module.

FIG. 7 illustrates a preferred reflector pattern. The illustrated herringbone reflector pattern shown in FIG. 7 essentially comprises a plurality of rows of parallel grooves 24C inclined at a 45° angle to the horizontal alternating with rows of parallel grooves 24D that are inclined at a 135° angle to the horizontal. Thus grooves 24D extend at a right angle to grooves 24C. Although the cells 8 are shown oriented with their edges extending parallel to the edges of the module, they may be oriented at an angle to those rows without adversely affecting the reflection of light onto the cells in the manner illustrated in FIG. 4. The reflector pattern of FIG. 7 is preferred since precise positioning of the cells in relation to the grooves is not critical and also since it has proven to improve power output by as much as 67%.

Referring again to FIG. 4, light passing through cover 4 will either impinge directly on cells 8, as illustrated by light ray R1, or impinge on the reflecting facets formed by surfaces 26 and reflecting coating 30, as illustrated by light ray R2. The latter ray will be reflected back into the transparent front cover member at an angle ø greater than the critical angle, and then reflected again internally from the front surface of the cover member so as to impinge on the solar cells. The term "critical angle" refers to the largest value that the angle of incidence may have for a ray of light passing from a more dense optical medium to a less dense optical medium. If the angle of incidence ø exceeds the critical angle, the ray of light will not enter the less dense medium (e.g., air) but will be totally internally reflected back into the denser medium (e.g., the transparent cover sheet).

For the purposes of this invention, the backskin is made of an ionomer/nylon alloy in sheet form as the back cover, as disclosed in copending U.S. patent application Ser. No. 10/171,021, filed Jun. 12, 2002 now U.S. Pat. No. 6,660,930 by Ronald C. Gonsiorawski for "Solar Cell Modules with Improved Backskin". The information disclosed in that copending U.S. application is incorporated herein by reference. The term "nylon" designates long chain polyamides that typically soften at temperatures near about 200° C. and melt at temperatures near about 420° C. As used herein, the term "alloy" is used to describe a blend of polymers, which may include copolymers that form a distinct polymer substance. Various ionomer/nylon alloys are available.

One commercially available ionomer/nylon alloy is the SURLYN® REFLECTIONS SG 201UC film that is a product of E. I. DuPont de Nemeurs Company. It is a thermoplastic material. The specifications of the SURLYN® REFLECTIONS SG 201UC Film are set forth in Table I. Although the exact chemical composition of the SG 201UC film is not known to Applicant, it appears to be composed of approximately 42% ionomer and 58% nylon by weight. Further it is readily identified by its physical properties. The physical and thermal properties are set forth in Tables II and III.

TABLE I

Material Specification of SG 201UC

| | |
|---|---|
| BASE MATERIAL | Dupont Surlyn SG201UC |
| COLOR | Natural Color |
| TiO2 (R960)-ADDITIVE | 10% |
| FILM THICKNESS (inch) | 0.010 |

TABLE II

Physical Properties of SG 201UC

| Property | Typical Value | Test Method |
|---|---|---|
| YOUNGS MODULUS | 560.5 Mpa (81279 psi) | ASTM D882 |
| TENSILE STRENGTH | 44.8 MPa (6500 psi) | ASTM D638 |
| ELONGATION AT BREAK | >200% | ASTM D638 |
| FLEXURAL MODULUS | 1139 MPa | ASTM D790 |
| IZOD IMPACT, NOTCHED | 266 J/m (5 ft-lb/in) @ −30° C. | ASTM D256 |
| SPECIFIC GRAVITY | 1.043 | ASTM D792 |
| DIELECTRIC STRENGTH | 1918 Volt/mil | ASTM D149 |
| MVTR (37.8 C., 100% RH g/H2O/100 in2/day/mil) | 0.93 | |

TABLE III

Thermal Properties of SG 201UC

| Property | Typical Value | Test Method |
|---|---|---|
| MELT FLOW INDEX | 5 dg/min | ASTM D1238 |
| MELT TEMPERATURE RANGE | 235–250° C. | |
| HDT @ 66 PSI | 58° C. (137° F.) | ASTM D648 |
| VICAT | 190° C. | ASTM D1525 |
| CLTE | 5.2 × 10−5 in/in-° F. | ASTM E831 |

The ASTM test methods listed in the foregoing tables are those in effect as of Dec. 31, 2002.

The present invention was evaluated and proven by making laminated modules with a textured backskin characterized by grooves as shown in FIG. 6 and a textured backskin characterized by a herringbone pattern of grooves as shown in FIG. 7. In each case the modules comprised a plurality of interconnected photovoltaic cells, a glass front cover, a back cover consisting of an embossed sheet of DuPont SURYLYN REFLECTIONS SG 201 U ionomer/nylon alloy with a silver coating on its embossed front surface, and several sheets of an ionomer as the encapsulant. In the case of the embodiment of FIG. 6, a module was made and tested using as the encapsulant sheets of a sodium ionomer product sold by AGP Plastics Inc. of Trumbauersville, Pa. 18970-0276 under the trademark Noviflex®. In the case of the embodiment of FIG. 7, modules were made using sheets of the following encapsulant materials: Noviflex modified sodium ionomer, and DuPont's Surlyn® 1705 zinc ionomer. Each encapsulant included a small amount (about 3-wt % of a UV absorber and a small amount of a UV stabilizer (also about 3 wt %).

By way of example, for the Surlyn® 1705 the UV absorber was Tinuvin™ 328 and the stabilizer was Chimassorb™ 944. Tinuvin 328, a product manufactured by Geigy Chemical Corporation of Ardsley, N.Y., is believed to be 2-(2H-benzotriazol-2-yl)-4,6-ditertpentylphenol. Chimassorb 944, also a product manufactured by Geigy Chemical Corporation, is identified by the manufacturer as a sterically hindered amine light stabilizer (commonly identified as HALS). More specifically, Chimassorb™ 944 is believed to have the following composition: poly[[6-[(1, 1, 3, 3-tetramethylbutyl)amino]-1, 3, 5-triazine-2, 4-diyl] [2, 2, 6, 6-tetramethyl-4-piperidiny) imino]-1,6-hexanediy[(2, 2, 6, 6-tetramethyl-4-piperidiny) imino]]. The UV stabilizer and UV absorber used with the Noviflex modified sodium ionomer were Cyasorb UV 3346 and Tinuvin 234. Cyasorb UV 3346 is a product of Cytec Industries Inc. and is believed to have the following composition: 1,6-hexanediamine, N,N'-Bis(2, 2,6,6-tetramethyl-4-piperidinyl)-,P/W 2,4-Dichloro-6-(4-morpholinyl)-1,3,5-triazine. Tinuvin 234 is Geigy product and is believed to have the following composition: 2-(2H-benzotriazol-2-yl)-4,6-bis(1-methyl-1-phenylethyl)phenol.

The cells were made from square polycrystalline silicon wafers cut out of EFG-grown bodies, with each cell measuring approximately 4 inches×2 inches. The ionomer/nylon alloy back sheet had a thickness of 0.010 inch, the V-shaped grooves had a depth of 0.004 inch, and the sides of each groove met at a convergent angle of about 120°. The silver coating was applied after the ionomer/nylon alloy sheet had been embossed with the multi-groove pattern as described and had a thickness of approximately 600 Angstroms.

The modules were laminated according to the method described above in connection with FIGS. 1 and 2 using a vacuum press-type laminator having a flat platen and a flexible vacuum bladder sheet. The components of the module were placed between the platen and bladder, with the glass sheet being engaged by the platen and the flat rear side of the ionomer/nylon alloy back sheet facing the bladder sheet and separated therefrom by a thin Teflon® release sheet. The laminator apparatus was operated at a temperature of about 120° C. and the components of the module were held in the press under a pressure of about 700 torr at that temperature for about 5 minutes, after which the heating was terminated and the laminated module allowed to cool in the laminator. Subsequently the apparatus was opened and the laminated module removed for evaluation.

Testing of the modules for electrical power output was conducted by illuminating each module with a solar simulator light source and measuring the short circuit current. A module with like cells but without any internal reflector was tested in the same manner. The module made with the Noviflex modified sodium ionomer encapsulant and a reflector pattern as shown in FIG. 6 showed a power output increase of about 49% over the module with no internal reflector. The module made according to the present invention using the reflector pattern shown in FIG. 7 and incorporating the same Noviflex® modified sodium Ionomer showed a power increase of about 67% over the module with no internal reflector, while the module with the same reflector pattern made with the Suryln® 1705 Ionomer showed a power increase of about 47%. It is believed that a power increase in excess of 70% may be achieved by precisely controlling the shape, depth and spacing of the grooves formed in the backskin.

An added advantage of using an ionomer/nylon sheet as the back cover is that it has helped to provide modules with improved reliability. As described in copending U.S. application Ser. No. 10/171,021, now U.S. Pat. No. 6,660,930, of Gonsiorawski, supra, modules manufactured according to the method described above in relation to FIGS. 1 and 2 and made using the foregoing SURLYN® REFLECTIONS SG 201UC ionomer/nylon in the form of a 0.010 inch thick sheet as the backskin material, and DuPont Surlyn® 1705 zinc ionomer as encapsulant, were found to show an electrical properties degradation of less than 4% after about 4000 hours of damp heat (at 85% RH/85° C.) and 200 temperature cycles (between 0 degrees C. and 90 degrees C.), a result not attainable with prior laminated solar modules constructed according to the same or a similar packaging format but using different backskin materials, e.g., Tedlar.RTM. (0.002 inch thick) and a TEDLAR®/polyester/TEDLAR® ("TPT") laminate (0.007 inch thick). Tedlar is a trade name for a polyvinyl fluoride polymer. That ionomer/nylon alloy also provides electrical insulation characteristics superior to TPT. It is believed that the improved stress test results achieved using the SURYLYN REFLECTIONS SG 201UC alloy are due primarily to the presence of its nylon component.

It is believed that comparable improvements in power output and also in stress test results can be obtained using other ionomer/nylon alloys characterized by different relative proportions of ionomer and nylon and/or a different nylon or ionomer component, provided that such other alloy is thermoplastic and has a melting point substantially higher than the encapsulant. The proportion of nylon in the ionomer/nylon alloy should be at least about 40%. The melting point should be at least about 200° C. A mold shrinkage of about 1% may be experienced in some embodiments and a mold temperature range of 40–80° may be employed. Embossing shallow but sharp grooves of V-shaped cross-section in one surface of a sheet or web of ionomer/nylon is readily carried out at 200° C., and the high melt point also facilitates formation of the silver coating by various techniques and avoids or resists distortion of the embossing in the module lamination step. An added benefit of using an ionomer/nylon alloy as herein described is that it bonds strongly to and is compatible with the ionomer encapsulant, and those properties are believed to be responsible at least in part to the improved reliability of the modules made in accordance with this invention. The reflective metal is applied to the ionomer/nylon alloy with a thickness that assures a continuous reflective coating and sharp facets. Preferably the silver coating thickness does not exceed 900 Angstroms.

Of course, the invention may be practiced using a different reflector pattern. However, the reflector pattern shown in FIG. 7 is preferred since it provides superior results. In this connection, it should be noted that the herringbone pattern may be shifted angularly relative to the cells, so that each set of grooves extends at an acute angle to the cells that is different from the angle shown in FIG. 7. The ionomer/nylon backskin thickness may vary, but should be in the range of about 0.010 to about 0.015 inch. The depth of the grooves 24 also may be varied without departing from the essence of the invention. However, the depth of the grooves is kept small, preferably not exceeding about ½ the thickness of the backskin. A further possible modification is to provide a back cover sheet with grooves running in three or more directions, e.g., grooves running horizontally, vertically and at a 45° degree angle to the other grooves. Similarly, the herringbone pattern illustrated in FIG. 7 may be modified by introducing additional columns of grooves wherein the grooves run at a different angle than the grooves 24C and 24D

Obviously it is possible to modify various other components of the solar modules and the method of laminating the components without departing from the scope of the invention. For one thing, the invention may be practiced using a different encapsulant, e.g., the DuPont Suryln® 1706 zinc ionomer or EVA. The latter bonds readily to an ionomer/nylon alloy material as well as to other backskin materials. In the case where EVA is used as the encapsulant, an optically transparent insulating layer is applied over the metal coating on the backskin, since EVA has been found to discolor if engaged directly with the ionomer/nylon backskin. For another thing the invention may be used in the manufacture of modules comprising different forms of solar cells known to persons skilled in the art. As is evident from the foregoing description, silicon solar cells of the type contemplated herein comprise silicon wafers with a p-n junction formed by doping, as disclosed, for example, in U.S. Pat. No. 4,751,191, issued Jun. 14, 1988 to R. C. Gonsiorawski et al, U.S. Pat. No. 5,178,685, issued Jan. 12, 1993 to J. T. Borenstein et al, and U.S. Pat. No. 5,270,248, issued Dec. 14, 1993 to M. D. Rosenblum et al. However, the invention may be used also in modules that comprise other crystalline cells formed independently of one another but interconnected by soldered conductors.

The invention also may be incorporated in modules that comprise so-called thin film solar cells. Typically such solar cell modules are produced by depositing several thin film layers on a substrate such as glass, with the layers being patterned so as to form a plurality of individual cells that are electrically interconnected to provide a suitable voltage output. Depending on the sequence in which the multi-layer deposition is carried out, the glass substrate may function as the back surface or as a front window for the module. By way of example, thin film solar cells are disclosed in U.S. Pat. No. 5,512,107, issued Apr. 30, 1996 to R. van der Berg; U.S. Pat. No. 5,948,176, issued Sep. 7, 1999 to K. V. Ramanathan et al.; U.S. Pat. No. 5,994,163, issued Nov. 30, 1999 to M. Bodegård et al.; U.S. Pat. No. 6,040,521, issued Mar. 21, 2000 to K. Kushiya et al; U.S. Pat. No. 6,137,048, issued Oct. 24, 2000 to X. Wu; and U.S. Pat. No. 6,258,620, issued Jul. 10, 2001 to D. L. Morel et al.

Examples of thin film solar cell modules are those that comprise cadmium telluride or CIGS thin film cells. The term CIGS is the acronym for the composition $Cu(InGa)(SeS)_2$. Use of the invention with thin film cells is limited to the case where the substrate on which the cells are formed is a glass plate that is intended to function as the front window of the module. In such case the ionomer/nylon sheet may be used as the backskin of the module, with an intervening thermoplastic encapsulant being interposed to seal the backskin to the glass plate under heat and pressure.

Another possible modification is to replace the glass front panel with a sheet of a transparent plastic material, e.g., a polycarbonate or an acrylic polymer. Also the number and thickness of the ionomer encapsulant sheets used in making the module also may be varied.

The advantages of the invention are several. First and foremost, the internal light reflection produced by those portions of the reflecting backskin that are not obscured by the solar cells serves to increase the power output of the cell array in the module by a relatively large percentage over what the same cell array produces where the module has no internal reflection capability, and the magnitude of that percentage increase is not suggested by the prior art. Secondly, the increased cell output resulting from the internal light reflection provided by the reflecting backskin in the spaces between adjacent cells makes it possible to achieve a specific power output with fewer cells than a conventional module, i.e., a module lacking the same internal reflection capability.

The orientation of the grooves formed in the backskin relative to that of the cells is critical, since as shown by the Sharp modules mentioned above, only a small increase in power output is possible if all of the grooves in the backskin run in the same direction. It is essential that the grooves in the spaces between and around the cells run in more than one direction in order to achieve the level of improvement in power output provided by this invention. On the other hand, so long as some grooves run in one direction and other grooves run in a second direction, orientation of the grooves relative to the cells is not critical. For example, substantially the same level of improvement in power output would be achieved if the arrangement shown in FIG. 6 is modified so that the grooves 24A run at an acute angle to the horizontal edges of the adjacent cells and the grooves 24B run at an acute angle to the vertical edges of the adjacent cells and also at an angle to grooves 24A. For the same reason, placement and orientation of the cells also is not critical relative to the grooves of the pattern of grooves shown in FIG. 7.

An added advantage is that the invention eliminates the need for introducing a reflecting substrate as an additional and separate component to be laminated, thereby simplifying the lamination procedure disclosed by Kardauskas U.S. Pat. No. 5,994,641. Another advantage of the invention is that it may be practiced using conventional solar cell module laminating apparatus and does not require any substantive change in the operating conditions of the conventional laminating process. Still another advantage is that the ionomer/nylon backskin has been shown to permit manufacture of PV modules that withstand post stress test deterioration better, by a significant factor, than modules of like construction made with other thermoplastic backskins. Moreover, embossing the facets in the backskin is accomplished as easily as making the facets in a separate sheet material as disclosed by Kardauskas. A further significant advantage is derived from the fact that a back sheet of an ionomer/nylon alloy as herein disclosed has a melting temperature range (235° C. to 250° C.) that enables the back sheet to maintain its structural integrity during the laminating procedure and effectively resist piercing or penetration and resist thermal distortion of the embossed pattern by any mechanical components, e.g., the stress loops of the electrical conductors, that may protrude backward from the plane of the solar cell array when the various layers (front panel, encapsulant, solar cell array, scrim and backskin) are compressed together during the laminating process. A further factor in preventing piercing by mechanical components is the thickness of the ionomer/nylon backskin. In contrast, a backskin comprising a combination of sodium and zinc ionomers, as taught by U.S. Pat. No. 5,741,370 of J. Hanoka, has a melting point closer to that of the encapsulant, with the result that there is a greater risk of a component like a stress loop violating the integrity of the backskin during or as a result of the laminating procedure.

Other modifications and advantages of the invention will be apparent to persons skilled in the art from the foregoing description.

What is claimed is:

1. A solar cell module comprising:
a back cover;
a transparent front cover overlying and spaced from said back cover;
a plurality of solar cells disposed between said front and back covers, said cells being spaced from one another and predetermined areas of said back cover being free of said solar cells; and
a light-transmitting material encapsulating said cells and bonded to said front and back covers;
characterized by said back cover comprising a sheet of an ionomer/nylon alloy having a plurality of light-reflecting facets facing said front cover and spanning beneath the plurality of solar cells, said facets having an angular relationship with respect to said front cover such that light (i) passing through said front cover and said light-transmitting material and (ii) impinging on said facets is reflected back through said light-transmitting material toward said front cover at an angle relative to said front cover which is greater than the critical angle, said reflected light being internally reflected back through said light-transmitting material toward said solar cells to produce a power output percentage increase of a least about 47% to about 70% over what same solar cell module produces where the module has no internal reflection capability, the plurality of solar cells being electrically isolated from the light-reflecting facets.

2. A solar cell module according to claim 1 wherein said light-reflecting facets include a light-reflecting coating comprising a metal film.

3. A solar cell module according to claim 2 wherein said light-reflecting coating is aluminum or silver.

4. A solar cell module according to claim 1 wherein said light-reflecting facets include a light-reflecting coating comprising a dielectric mirror coating.

5. A solar cell module according to claim 4 wherein said light reflecting coating comprises a plurality of layers of inorganic films arranged to provide a mirror function.

6. A solar cell module according to claim 1 wherein said back cover has a plurality of parallel V-shaped grooves in one surface thereof with said facets constituting the sides of said grooves.

7. A solar cell module according to claim 6 wherein said grooves have a depth of approximately 0.004 inch.

8. A solar cell module according to claim 7 wherein said back cover has a thickness of about 0.010 inch.

9. A solar cell module according to claim 6 wherein some of said grooves extend in a first direction and others of said grooves extend in a second direction.

10. A solar cell module according to claim 9 wherein said grooves form a herringbone pattern.

11. A solar cell module according to claim 6 wherein said grooves have an enclosed angle between 110° and 130°.

12. A solar cell module according to claim 1 wherein said front cover is a flat sheet and further wherein each facet extends at an angle between 25 and 35 degrees relative to the plane of said front cover.

13. A solar cell module according to claim 1 wherein said back cover is opaque.

14. A solar cell module according to claim 1 wherein said ionomer/nylon alloy has the following characteristics: a tensile strength of about 6500 psi, a tensile modulus (Young's) of about 81279 psi, a Vicat value of 190° C., a specific gravity of 1.043, a mold shrinkage of about 1.0%, a melt temperature range of 235–250° C., a mold temperature range of 40–80° C., and a dielectric strength of about 1918 Volt/mil.

15. A solar cell module according to claim 1 wherein each of said front and rear covers has a front surface and a rear surface with said rear surfaces facing in the same direction, and further including a frame surrounding said module, said frame having first portions extending over and bonded to said front surface of said front cover and second portions extending below and bonded to said rear surface of said back cover.

16. A solar cell module according to claim 1 further comprising an electrically insulating material between at least said solar cells and said light reflecting facets.

17. A method of increasing the output current of an array of solar cells in a module having a transparent front cover, a back cover, a plurality of solar cells arranged in rows and columns between said front and back covers with spaces between said rows and also between said columns, and a light-transmitting material encapsulating said cells and bonded to said front and back covers, said method comprising:

(1) using as said back cover an ionomer/nylon alloy sheet having a light-reflecting coating and a plurality of embossed V-shaped grooves facing said front cover, with said grooves forming light-reflecting facets spanning beneath the array of solar cells with said facets oriented at an angle of between 25 and 35 degrees to said front cover, at last some of said facets being located in line with said spaces; and (2) reflecting solar radiation impinging on said facets via said transparent front cover, said light-transmitting encapsulating material and said spaces back toward said transparent front cover so that said reflected solar radiation will be reflected internally from said front cover to said solar cells to produce a power output percentage increase of at least about 47% to about 70% over what the same solar cell module produces where the module has no internal reflection capability, the solar cells being electrically isolated from the light reflecting facets and light impinging on said facets being directed onto said solar cells and increasing the output current of said solar cell module.

18. A method according to claim 17 wherein said grooves have a depth of approximately 0.004 inch.

19. A method according to claim 17 wherein said back cover has a front surface facing said front cover and said facets face said front cover, wherein areas of said front surface between said rows and between said columns are exposed to receive solar radiation transmitted through said front cover.

* * * * *